United States Patent [19]

Bradler et al.

[11] Patent Number: 4,519,865
[45] Date of Patent: May 28, 1985

[54] DEVICE FOR TWO-SIDED APPLICATION OF FOILS OR SIMILAR MATERIAL ONTO PLATE-SHAPED WORKPIECES, AND METHOD OF OPERATING THE SAME

[75] Inventors: Hans J. Bradler, Magstadt; Wilfried Brauner, Kuppingen; Manfred Deyhle, Hildrizhausen; Karl H. Vogt, Herrenberg, all of Fed. Rep. of Germany

[73] Assignee: International Business Machines Corporation, Armonk, N.Y.

[21] Appl. No.: 556,863

[22] Filed: Nov. 30, 1983

[30] Foreign Application Priority Data

Feb. 18, 1983 [EP] European Pat. Off. ........ 83101541.7

[51] Int. Cl.³ ............................................. B32B 31/10
[52] U.S. Cl. .................................... 156/256; 156/516; 156/517; 156/521; 156/555; 156/556; 156/568
[58] Field of Search ............... 156/250, 256, 264, 265, 156/516, 517, 521, 522, 555, 556, 567, 568, 582

[56] References Cited

U.S. PATENT DOCUMENTS

| | | | |
|---|---|---|---|
| 2,449,298 | 9/1948 | Hoppe | 156/568 |
| 3,379,601 | 4/1968 | Pagay | 156/568 |
| 3,658,629 | 4/1972 | Cramer et al. | 156/552 |
| 3,772,120 | 11/1973 | Radzins | 156/521 |
| 3,963,557 | 6/1976 | Patterson | 156/568 |
| 4,025,380 | 5/1977 | Bernardo | 156/355 |

FOREIGN PATENT DOCUMENTS

| | | |
|---|---|---|
| 85793 | 8/1983 | European Pat. Off. |
| 470965 | 5/1969 | Switzerland |
| 27173 | of 1914 | United Kingdom |

Primary Examiner—Caleb Weston
Attorney, Agent, or Firm—M. F. Chadurjian; J. Jancin, Jr.; E. W. Galbi

[57] ABSTRACT

Supplying of foils to be applied to both sides of a workpiece. Opposing feeding drums have identical exchangeable segments whose circumferential lengths correspond to the length of the respective foil segment lamina, and whose segment angle sums are less than 360°. In order to affix a leading edge of the foil to the leading edge of the workpiece, the foil is cut at the back end of the segment, and a first segment (on whose circumference the foil segment lamina is fixed) is moved toward the workpiece. After the foil adheres to the board, the drum segment is withdrawn. During the course of further movement of the workpiece, the foil segment is stripped off the segment by use of a laminating roller and a vacuum shoe. The drum is then rotated so that for the next workpiece to be laminated, the second segment will become operative as a supply element for the foil.

16 Claims, 8 Drawing Figures

DEVICE FOR TWO-SIDED APPLICATION OF FOILS OR SIMILAR MATERIAL ONTO PLATE-SHAPED WORKPIECES, AND METHOD OF OPERATING THE SAME

TECHNICAL FIELD

The invention relates to a device for the two-sided application of foils or similar materials onto plate-shaped workpieces by means of a pair of rotary driven laminating rolls between which the workpieces are successively guided, and a method of operating the same.

BACKGROUND ART

Laminators have been used in the art to apply photoresist layers onto circuit panels. Foil webs made up of a protective polyethylene layer, a photoresist layer, and a Mylar protective foil have been supplied from rollers and are continuously laminated to both sides of the circuit panels. Subsequently, the thus obtained webs are cut at the respective edges of the workpieces.

U.S. Pat. No. 3,658,629 discloses an improved photoresist applicator in which a pair of vacuum-connected drums are utilized to supply the foil webs to both sides of a circuit panel. Pressure strips on the circumference of the drums serve to affix the foil webs to the drums. After the removal of the protective layer thereon, the foil webs are removed from the drum circumference owing to the continuous drum rotation. Subsequently, the workpieces pass through heated laminating rollers in order to secure the foil onto the workpiece. A disadvantage of this design is that the foil can prematurely detach itself from the drum circumference. As a consequence, the foil could prematurely come into contact with the surface of the workpiece, causing wrinkles to form when the foil is laminated onto the workpiece. Furthermore, in this device only uniform foil segments can be cut, and consequently only workpieces of a predetermined size can be processed.

Another laminator is described in U.S. Pat. No. 4,025,380. The foil webs are applied to the leading edge of the heated workpiece by means of vacuum bails moving back and forth in a sliding mechanism. The webs are affixed with their leading edges before laminator rollers are activated. Position sensor switches activate the bails as well as the cutter mechanism. The switches can be adjusted so that different lengths of workpiece and foil segments can be handled The trailing edges of the foil segments are drawn over vacuum shoes after cutting, which prevents the foil from prematurely contacting the workpiece surface.

The foregoing and other laminating devices suffer from a common operational deficiency. During lamination the workpieces do not move in a continuous fashion; rather they have to be stopped when the foil (most of which is already laminated) is cut to the required length. This stoppage of the workpiece (or panel) during lamination frequently causes an undesired prepolymerization. Specifically, the laminator rollers are heated to ensure a safe application of the lamina onto the surface of the workpiece, even if the workpiece itself has been heated previously. The photoresist-coated workpiece undergoes concentrated heating upon standstill, causing prepolymerization. This disadvantage increases in magnitude with the increase in intricacy of the conductive lines of the panel. Therefore, in view of the progress in miniaturization of circuit patterns in the art, elimination of the above-described deficiency is required.

SUMMARY OF THE INVENTION

It is thus an object of the invention to provide an improved laminating device.

It is another object of the invention to provide a device for laminating circuit panels or boards, wherein the process can be carried out during the continuous advance of the workpieces.

It is yet another object of the invention to promote the uniform processing of foils onto circuit panels or boards.

It is a further another object of the invention to improve the coating quality of the workpieces.

These and other objects are realized by a plurality of foil-applying drums which supply the foils to be laminated onto a workpiece. Each drum comprises two segments, each of which has a segment angle of less than 180°. Each segment comprises a plurality of portions of equal circumference.

In the method of the invention, the foil on the drums is cut such that both drum segments have separate foil segments. One of the drum segments is rotated to a position in which an edge of the foil segment is in alignment with an edge of the workpiece to be laminated. The drum segments are then brought into abutment with each side of the workpiece, causing the edges of the foil segments thereon to adhere to the workpiece. Subsequently, the drum segments are moved away from the board, and a plurality of laminating rollers are moved into the space between the foil segments (which now extend from the drums to the workpiece) and the drums. A plurality of vacuum shoes pivotably connected to the rollers are set to precisely define the angle of incidence between the workpiece and the foils as the foils are stripped off the drum segments. As the workpiece is advanced, the rollers and the vacuum shoes control the tension and angle of incidence of the foils. When the workpiece is completely laminated, both drum segments are rotated such that, for the next workpiece to be laminated, the other of the drum segments will serve as a supply element for the foil. Prior to the next lamination processing, the foil on the drums is once again cut into foil segments, thus eliminating the prepolymerization of the foil.

BRIEF DESCRIPTION OF THE DRAWING

In the description to follow, reference will be made to the appended drawings, in which.

BEST MODE FOR CARRYING OUT THE INVENTION

Figure 1:
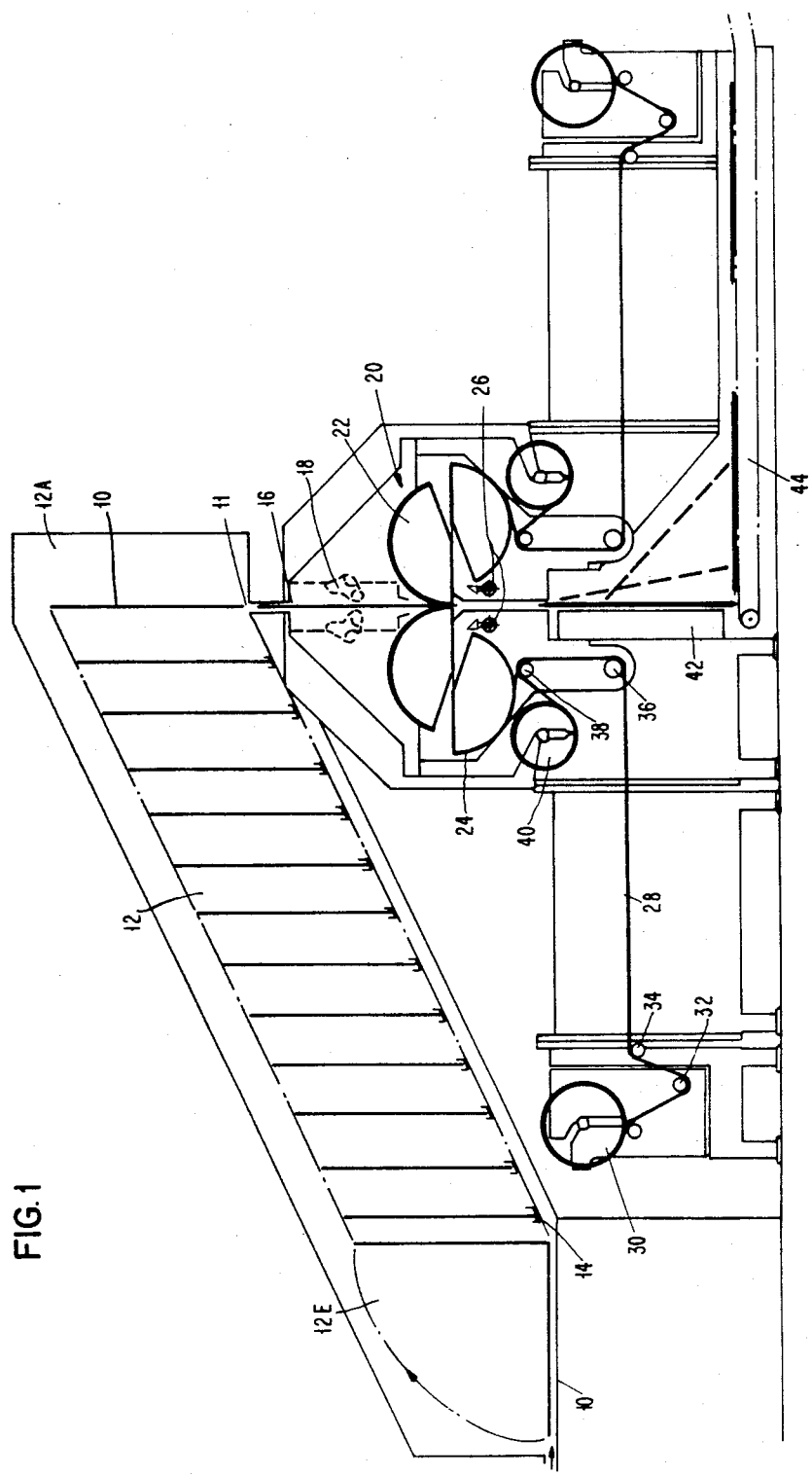
FIG. 1 is a schematic lateral view of a preferred embodiment of the present invention.

Referring to FIG. 1, circuit panels or boards 10 are supplied individually from a reservoir or stack (not shown) and are transported to an oven 12. Each circuit board 10 is typically coated with copper and soaked in epoxide resin. The boards 10 are approximately 500×700 mm and are 0.5 mm in thickness. The boards 10 enter the oven 12 through entering zone 12E, where they are switched from a horizontal to a vertical position and are transported in the latter position through oven 12 by means of an inclined transport unit 14. The temperature in oven 12 and the feeding period of boards 10 are set such that boards 10 have a temperature of approximately 120° C. at exiting zone 12A of oven 12.

After leaving exiting zone 12A, boards 10 are conveyed downwardly within a vertical guide 16 by means of roller pairs 18, and arrive at laminating station 20. Details of the structure and function of lamination station 20 will be described in more detail hereinafter; at this time, the basic arrangement of lamination station 20 will be reviewed. Boards 10 pass between (or among) feeding drums 22 and lamination rollers 26 for the purpose of having foil 24 laminated thereon. The word "among" is used here to mean that where the laminating station 20 has two, three, four or more feeding drums 22, the boards 10 are conveyed to a position where (a) at least one of the drums 22 is disposed opposite one side of the board 10 and (b) where another one of the drums 22 is disposed opposite the other side of board 10.

The photoresist foil webs 28 are supplied from supply drums 30 via rollers 32, 34, 36, 38, respectively, to feeding drums 22.

The web is fixed onto the circumference of the drums 22 by vacuum means. The vacuum means comprises openings (not shown) provided on the circumference of feeding drums 22 which and are connected to a vacuum source (not shown). The openings are distributed over the drum circumference in such a manner that the foil webs follow the rotational movements of feeding drums 22. The foil webs 28 consist of a photoresist film having a protective polyethylene foil on one side and a protective Mylar layer on the other side thereof. The structure of the foil is furnished by way of illustration, and is not to be construed as limitative on the scope of the invention.

While passing over roll 36, the protective polyethylene film is stripped from the photoresist film of foil 28 and wound onto drum 40. Laminating station 20 is designed for two-sided lamination. Thus station 20 is symmetrically designed with respect to vertical guide 16 so that the foregoing description applies to both respective sides. After boards 10 have passed through laminating station 20, they reach an ejection chute 42 where they are deposited onto a conveyor belt 44 and transported to the next processing device, e.g. for exposure.

The above-described arrangement of the vertical passage of boards 10 through laminating station 20 has specific advantages, for example, in connection with the utilization of gravity during the transport of the boards. However, if it is more advisable (e.g., for space reasons) to provide an arrangement for the horizontal passage of the boards, the present invention encompasses an arrangement in which the oven is arranged vertically so as to require less space. Moreover, while the present invention is described in relation to an embodiment having two laminating drums, it is to be understood that the teachings of the invention apply to a laminating device having any number of laminating drums (i.e., one or more drums).

With reference to FIGS. 2A to 2G, the structure of laminating station 20 and the individual steps of the laminating process will now be described in more detail. As pointed out above, the plane in which the boards pass through the station represents a symmetrical plane, such that the structure and function of the individual parts of the right hand side of the station corresponds to those as described on the left hand side.

As shown in the drawings, feeding drum 22 consist of two equal segments 22A and 22B. The "segments" are circle segments (i.e., pie-slice shaped), the arcuate surfaces of which carry the foil (or lamina). The circumference of each drum subtends an angle of less than 360°. In other words, the sum of the segment angles (i.e., the angle defined by the intersection of the ends of each segment) is less than 360°. In the embodiment shown, each segment has a segment angle of less than 180°. As shown most clearly in FIG. 2C, the segments 22A and 22B are radially adjustable independent of each other. Further, segments 22A and 22B can be rotated about a central drum axis 23 of feeding drum 22.

Laminating rollers 26 are disposed between feeding drums 22. As indicated by the arrows in FIG. 2E, rollers 26 are vertically and horizontally adjustable. The adjustment of drum segments 22A, 22B as well as that of laminating rollers 26 is effected by a driving means not shown in the drawings. Such a driving means could comprise a series of electromagnets in connection with sliding mechanisms, although it is not limited thereto. Vacuum chucks 46 are pivotably arranged about the axes of laminating rollers 26. As shown most clearly in FIG. 2A, shear blades 48 are disposed on opposite sides of feeding drums 22 and are vertically movable along horizontal plane AA to sever foil 24.

Figure 2A:
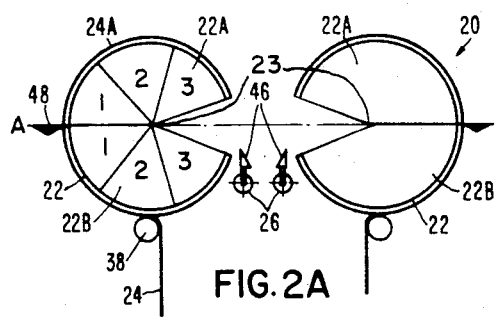
FIGS. 2A–2G show the relative positions of the laminating rolls and feeding drums of the laminator of FIG. 1 during specific phases of a complete laminating cycle.

FIG. 2A represents laminating station 20 at its starting position, which occurs after the ejection of a laminated board and before the supply of a new board. Foil 24 supplied via roller 36 is placed against drum 22 circumference. The leading edge of foil 24 is disposed at the right hand end of drum segment 22A (which is disposed at an angle of approximately 30° with respect to the horizontal plane AA). Shear blade 48 now moves along plane AA (i.e., toward the seam between drum segments 22A and 22B) cuts foil 24 such that a foil segment 24A is created which lies on the circumference of drum segment 22A. The foils on the circumferences of segments 22A and 22B are kept stationary by means of openings in the circumferences of segments 22A, 22B which are connected to vacuum sources, as previously described. Each of the segments 22A, 22B is subdivided into three vacuum chambers 1-3. Note that the segments of the drums could be of any number or angle (i.e., the segments could be defined by any number of vacuum chambers). The circumferential length of each segment corresponds to the length of the workpiece to be laminated. Thus, the length of the cut-off foil segment is approximately the same as the length of the workpiece, such that each drum segment 22A, 22B has a foil segment 24A, 24B of a length sufficient to substantially laminate the workpiece.

Figure 2E:
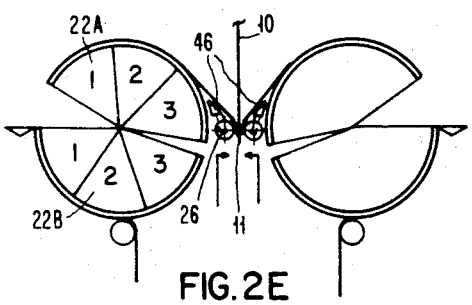
Figure 2B:
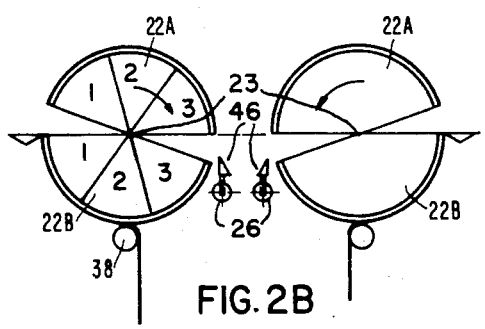

As shown in FIG. 2B, upper drum segment 22A executes a clockwise rotation until the right-hand end thereof is precisely horizontal, i.e., the ends of the two upper segments 22A on the left hand and right hand sides are opposite each other along horizontal plane AA.

Figure 2F:
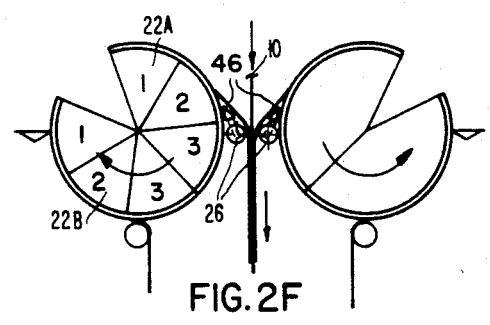
Figure 2C:
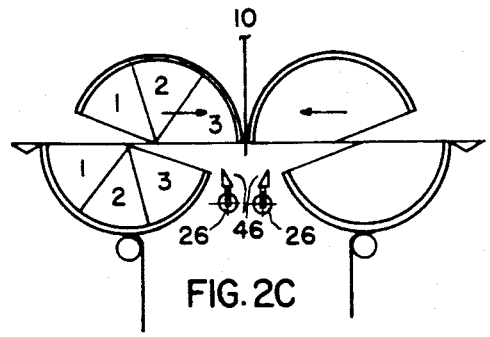

In the meantime, as a board 10 is supplied from above, segments 22A are simultaneously moved toward each other (FIG. 2C). This motion causes the leading edges of foil segments 24A to contact both sides of the leading edge of board 10. Owing to the photoresist layer composition and to the heat stressing of the board, the foil segments adhere to the board.

As outlined in FIG. 2D, drum segments 22A are subsequently withdrawn from each other (see long arrows). At the same time, the segments 22A complete a partial rotation under the pulling effect of the affixed foil (see small arrows). Note that foils 24A are pulled away from a portion of the circumferences of drum segments 22A.

As shown in FIG. 2E, laminating rollers 26 are now moved upwardly toward each other (see long arrows) and inwardly toward each other (see small arrows) from a storage position to an operating position. In this manner, the laminating rollers 26 are brought into contact with the foil adhered to the leading edge of the board. During this process, vacuum shoes 46 are inserted in the space between the foil and the drum. During the lamination process, the vacuum shoes 46 maintain foil 24A at a preselected angle of incidence, thus preventing premature and/or uncontrolled welding of foil 24A with the surface of board 10.

FIG. 2F shows that during lamination the foils are stripped off segments 22A and placed over vacuum shoes 46 under a predetermined tension caused by the adhesive abutment of the foil and the workpiece as controlled by laminating rollers 26. During this lamination process, drum segments 22A and 22B are in rotational contact. As indicated by the arrow, segment 22A contacts segment 22B, causing the two segments to rotate as one.

Figure 2G:
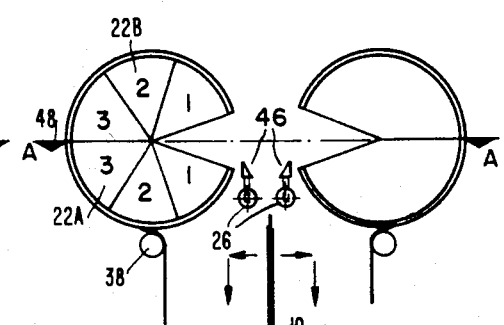
Figure 2D:
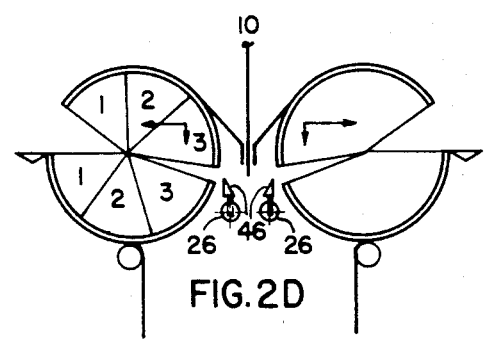

As shown in FIG. 2G, laminating rollers 26 are moved away from each other (see small arrows) and in a downward direction (see long arrows) at the completion of the lamination process. Vacuum shoes 46 are rotated into their ineffective (i.e., inactive) position, and at the same time segments 22A and 22B resume their starting position in accordance with FIG. 2A. Note that the next foil segment (i.e., foil segment 24B shown in FIG. 2A) is cut by means of shear blades 48 before the start of the next lamination.

Thus, the present invention discloses means by which boards can be laminated in an efficient manner. In particular, the segmented drums of the invention precisely control the dispensing of the foils onto the board surfaces. Furthermore, the lamination rollers and the vacuum shoes cause the angle of incidence of the foil to be maintained at a constant value during lamination. The present invention precisely controls the tension of the foil, eliminating the tearing of the weld. It is a particular advantage of the invention that the foil segments for the next workpiece are cut off prior to the start of the next laminating process, so that the subsequent process can be carried out without interruption.

It is to be understood that modifications can be made to the structures and teachings of the foregoing description of the best mode for carrying out the invention as described above without departing from the spirit and scope of the present invention as well as the appended claims.

We claim:

1. An apparatus for laminating a substrate with a lamina, comprising:
a plurality of drums having the lamina disposed thereon, each one of said plurality of drums comprising a plurality of drum segments, said plurality of drum segments of each of said plurality of drums having a segment angle sum of less than 360°, each of said plurality of drum segments of each of said plurality of drums being rotatable about a central axis of each of said plurality of drums without inducing rotation of any other of said drum segments;
first means for cutting the lamina disposed on each of said plurality of drums into discrete lamina segments, each of said lamina segments being disposed on one of said plurality of drum segments of each of said plurality of drums;
second means for conveying the substrate to a position among said plurality of drums; and
third means for forcing one of said lamina segments from one of said plurality of drum segments of at least one of said plurality drums into adhesive abutment with the substrate, said forcing means controlling the angle of coincidence between said one of said lamina segments and the substrate.

2. The laminating apparatus as recited in claim 1, further comprising:
a lamina source; and
fourth means for conveying said lamina from said source to said plurality of segments of said plurality of drums.

3. The laminating apparatus as recited in claim 1 wherein each of said lamina segments are of a length sufficient to substantially laminate each of said substrates.

4. The laminating apparatus as recited in claim 1, wherein each of said plurality of drum segments of each of said plurality of drums are radially adjustable independent of one another.

5. The laminating apparatus as recited in claim 1, wherein each of said plurality of drum segments have a segment angle of less than 180°.

6. The laminating apparatus as recited in claim 5, wherein each of said plurality of drum segments are pie-slice shaped, an arcuate surface thereof carrying said lamina, the arcuate surface being of a length approximately equal to that of said lamina segments.

7. The laminating apparatus as recited in claim 6 wherein each of said plurality of drum segments comprise a plurality of separate vacuum chambers.

8. An apparatus for the two-sided application of foil segments onto workpieces by means of a plurality of rotary driven laminating rollers between which the workpieces are successively guided, the foil segments being supplied by a plurality of vacuum-admitting supply drums, wherein each one of the plurality of supply drums comprises:
a plurality of drum segments having arcuate surface lengths approximately equal to the length of each of the foil segments, each of said plurality of drum segments being radially adjustable independent of each other and rotatable about a central axis of each of said plurality of supply drums without inducing rotation of any other of said drum segments; and
shear blades mounted for movement along a seam between each of said plurality of drum segments of each one of the plurality of supply drums when said plurality of supply drums are at a starting position, said shear blades cutting foil disposed on each of said plurality of supply drums to define the foil segments prior to the application of the foil segments onto the workpieces.

9. The apparatus as recited in claim 8, further comprising means for maintaining a preselected angle of incidence between the foil segments supplied by the plurality of supply drums and the workpiece.

10. The apparatus as recited in claim 9, wherein said angle maintenance means comprises a plurality of vacuum shoes, each of which are pivotably connected to one of the plurality of laminating rollers.

11. The apparatus as recited in claim 8, wherein each of said plurality of drum segments comprises a plurality of pie-slice shaped vacuum chambers.

12. A method for continuously operating a laminating device for laminating the surface of a workpiece with a lamina, comprising the steps of:
(a) conveying workpieces to a laminating station wherein workpieces are sequentially disposed between feeding drums, each of said feeding drums comprising first and second drum segments having a segment angle sum of less than 360°, said first and second drum segments having first and second lamina segments disposed thereon, respectively;
(b) rotating said first drum segments of said feeding drums to an angular position wherein a leading edge of said first lamina segments is aligned with a leading edge of the workpiece;
(c) shifting said first drum segments toward the workpiece to a position wherein said leading edge of said first lamina segments abut said leading edge of the workpiece;
(d) shifting said first drum segments away from the workpiece, said leading edges of said first lamina segments adhering to said leading edge of the workpiece;
(e) shifting a plurality of laminating rollers from a storage position into an operating position in which each of said plurality of laminating rollers abut a portion of one of said first lamina segments extending between said first drum segments and the workpiece;
(f) rotating said first and second drum segments of the feeding drums and said plurality of laminating rollers to strip said first lamina segments off of said first drum segments and applying the stripped-off lamina to the workpiece;
(g) while said first drum segments are being rotated in step (f), conveying lamina from a lamina source to the circumferences of said feeding drums; and
(h) after completion of step (f), cutting said lamina on said feeding drums prior to conveying a subsequent workpiece to be laminated; and
(i) after completion of step (f), shifting said laminating rollers from said operating position to said storage position.

13. The method of operating a laminating device as recited in claim 12, wherein each of said plurality of laminating rollers have one of a plurality of vacuum shoes pivotably connected thereto, said plurality of vacuum shoes maintaining a constant angle of incidence between said stripped-off lamina and said workpiece as said stripped-off lamina is applied to the workpiece while said laminating rollers are in said operating position.

14. The laminating apparatus as recited in claim 1, wherein said second means comprises an inclined transport unit disposed within an oven.

15. The laminating apparatus as recited in claim 14, wherein said third means comprises a plurality of laminating rollers with vacuum shoes pivotably attached thereto.

16. An apparatus for laminating a substrate with a lamina, comprising:
at least one drum having the lamina disposed thereon, said drum comprising a plurality of drum segments having a segment angle sum of less than 360°, said segments being independently rotatable about a central axis of said drums and independently radially adjustable along a substantially horizontal plane, each one of said plurality of drum segments comprising a plurality of separate vacuum chambers;
first means for conveying the lamina from a lamina source to said drum;
second means for cutting the lamina disposed on the drum into discrete lamina segments prior to laminating the substrate, each of said lamina segments being disposed on one of said plurality of drum segments;
third means for vertically conveying the substrate through an oven to a lamination position; and
at least one laminating roller for forcing said lamina from one of said plurality of segments of said drum into adhesive abutment with the substrate, said laminating roller having a pivotally connected vacuum shoe for controlling the angle of incidence between said lamina and the substrate.

* * * * *

UNITED STATES PATENT AND TRADEMARK OFFICE
CERTIFICATE OF CORRECTION

PATENT NO. : 4,519,865
DATED : May 28, 1985
INVENTOR(S) : Hans J. Bradler et al

It is certified that error appears in the above-identified patent and that said Letters Patent is hereby corrected as shown below:

Claim 1 -- Col. 6, line 10  "coincidence" should be --incidence--.

Signed and Sealed this

Fifteenth Day of October 1985

[SEAL]

Attest:

DONALD J. QUIGG

Attesting Officer

Commissioner of Patents and
Trademarks—Designate